(12) United States Patent
Stuppi

(10) Patent No.: US 9,736,900 B1
(45) Date of Patent: Aug. 15, 2017

(54) QUANTUM DOT TUNABLE ASSEMBLIES AND METHODS

(71) Applicant: Rockwell Collins, Inc., Cedar Rapids, IA (US)

(72) Inventor: Albert N. Stuppi, Springville, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 15/183,388

(22) Filed: Jun. 15, 2016

(51) Int. Cl.
| | |
|---|---|
| *G02F 1/1335* | (2006.01) |
| *H05B 33/08* | (2006.01) |
| *F21V 23/00* | (2015.01) |
| *F21K 9/64* | (2016.01) |
| *F21K 9/90* | (2016.01) |
| *F21Y 115/10* | (2016.01) |
| *F21Y 113/13* | (2016.01) |

(52) U.S. Cl.
CPC ........... *H05B 33/0845* (2013.01); *F21K 9/64* (2016.08); *F21K 9/90* (2013.01); *F21V 23/003* (2013.01); *G02F 1/133617* (2013.01); *G02F 1/133621* (2013.01); *H05B 33/0857* (2013.01); *F21Y 2113/13* (2016.08); *F21Y 2115/10* (2016.08); *G02F 2001/133614* (2013.01); *G02F 2202/36* (2013.01)

(58) Field of Classification Search
CPC ......... G02F 1/133603; G02F 1/133609; G02F 1/133615; G02F 1/133617; G02F 2001/133567; G02F 2011/133614
USPC ...................................... 349/62, 65, 69, 106
See application file for complete search history.

(56) References Cited

U.S. PATENT DOCUMENTS

| | | | |
|---|---|---|---|
| 9,199,842 B2 * | 12/2015 | Dubrow | B82Y 20/00 |
| 9,535,282 B1 * | 1/2017 | Stuppi | G02F 1/133553 |
| 2016/0085118 A1 * | 3/2016 | Lee | G02F 1/133512 349/62 |
| 2016/0349573 A1 * | 12/2016 | Ohmuro | G02F 1/1336 |
| 2017/0123267 A1 * | 5/2017 | Yanai | G02F 1/133536 |
| 2017/0146859 A1 * | 5/2017 | Lin | G02F 1/133617 |

* cited by examiner

*Primary Examiner* — Tung X Le
(74) *Attorney, Agent, or Firm* — Angel N. Gerdzhikov; Donna P. Suchy; Daniel M. Barbieri

(57) ABSTRACT

A tunable light generating assembly uses ultraviolet and blue light emitting diodes to pump red and green quantum dots in a quantum dot layer to generate white light. A dielectric mirror substrate having a wavelength selective reflectance is configured to reflect ultraviolet wavelengths, and to pass blue and longer wavelengths. The portion of the ultraviolet light that is not absorbed in the quantum dot layer is reflected rather than transmitted, where it has another chance to be absorbed in the quantum dot layer, thereby increasing the overall conversion efficiency. The increased energy associated with the ultraviolet light further results in greater conversion efficiency in the quantum dot layer. The ultraviolet and blue LEDs may be driven by an electronic circuit that varies the amount of power applied to each LED to control the brightness and color balance of the generated white light.

20 Claims, 6 Drawing Sheets

QUANTUM DOT TUNABLE ASSEMBLIES AND METHODS

BACKGROUND

The inventive concepts disclosed herein are directed to generation of tunable color-balanced light from an electrical energy source.

The landmark invention of the incandescent light bulb by Thomas Edison profoundly impacted society by making it possible for people to operate and function normally after daylight has ended. The color of the light generated by an incandescent light bulb is primarily determined by the black body temperature of the glowing filament, which is generally below about 3400 Kelvin. The electrical to light conversion efficiency of incandescent light bulbs is relatively low—on the order of about 8-10 lumens per watt.

Fluorescent light bulbs generate light by electrically exciting gases in a glass tube to create a plasma that emits high concentrations of ultraviolet light. This ultraviolet light is converted to visible light by a layer of phosphors on the inside of the tube that converts the ultraviolet light to longer visible wavelengths. By selecting the mix of phosphor materials, it is possible to create essentially any output color. Fluorescent light bulbs are much more efficient than incandescent light bulbs, with electrical to light efficiency on the order of about 40-60 lumens per watt. A significant disadvantage of fluorescent light bulbs is that they contain mercury, which is toxic and harmful to the environment.

Light emitting diodes (LEDs) are solid state semiconductor devices that emit light when driven by a bias current. The wavelength of the emitted light is a function of the semiconductor materials used to fabricate the LED device. LEDs are manufactured today with output colors of infrared, red, orange, yellow, green, blue, violet, and ultraviolet. It is possible to create light of any color using a combination of red, green and blue LEDs. The electrical to light conversion efficiency of LEDs is on the order of about 50-90 lumens per watt, which is superior to fluorescent light bulbs without the disadvantages of toxic materials or limited physical characteristics.

One of the challenges for the use of LEDs as individual spectral light sources is cost—creation of white light using sets of three LEDs requires more components and is more complex than fluorescent tubes.

One solution to the cost challenge is the use of a single blue LED arranged to excite and be combined with the output of yellow or red and green phosphors to create white light. A recent improvement in phosphor technology is quantum dots, which are nanoscale particles of semiconductor materials. When excited or "pumped" by relatively short and therefore higher energy light, quantum dots emit light in wavelengths determined by the type of material and the particle diameter. Larger quantum dots with diameter on the order of 10-12 nanometers may emit light in the relatively longer red or orange wavelengths. Smaller quantum dots with diameter on the order of 4-6 nanometers may emit light in the relatively shorter green or blue wavelengths.

An important property of quantum dots is absorption of all wavelengths higher in energy than their bandgap that are then converted into a single color, i.e. they have broad absorption spectra, but narrow emission spectra. This property contributes to improved conversion efficiency from the input pumping light source to the output emission spectra.

One drawback of quantum dot technology is that some of the blue LED pump emission spectrum passes through the conversion layer unconverted, which may adversely affect the balance of the luminance ratio of the constituent wavelengths of the white light. Excessive blue light mixed with yellow or green and red light will result in the white light being bluish in color. Conversely insufficient blue light mixed with yellow or green and red light will result in the white light being yellowish in color.

Another drawback of an LED pumped quantum dot light generation system is failure of the pumping energy to be converted to light through the quantum dot in a single pass. Recovering and reapplying unconverted pumping energy to the quantum dots may improve the conversion efficiency.

One attempt at increasing the conversion efficiency of the pump wavelength has been incorporation of the quantum dots in a diffusing medium thus increasing the effective path length of the light. This diffusing medium does increase overall conversion but also suffers from absorption losses in the backlight cavity.

One important application of white light generating sources is liquid crystal displays (LCDs). LCDs are arrays of very small, electronically switched pixels that alternately transmit or block light through the pixel. Color LCDs employ an array of color filters that control both the amount and color of light that passes through the LCD array. Because the LCD is only an array of light switches or shutters, a light source is needed to provide the light to be transmitted through the LCD. One convenient and efficient geometry for the light source for an LCD is a relatively planar light emitting surface that may be placed in close proximity behind the LCD plane, in a configuration known as direct view backlighting. The quality of the color rendering of a color LCD is dependent on the white color balance of the backlighting source and the color balance of the LCD color filters.

SUMMARY

In one aspect, the inventive concepts disclosed herein are directed to a light-emitting assembly. The assembly includes a first light source configured to emit ultraviolet wavelength light and a second light source configured to emit blue wavelength light. A quantum-dot layer is optically coupled with the first and second light sources so that the ultraviolet wavelength light and the blue wavelength light pass through the quantum-dot layer and are converted into output light comprising the ultraviolet wavelength, the blue wavelength, and at least one wavelength longer than the ultraviolet wavelength and the blue wavelength A selectively-reflective layer is optically coupled with the quantum-dot layer such that a first portion of the output light having the ultraviolet wavelength is reflected toward the quantum-dot layer, and a second portion of the output light having the blue wavelength and the at least one wavelength longer than the blue wavelength is transmitted through the selectively-reflective layer.

In a further aspect, the inventive concepts disclosed herein are directed to a light-emitting assembly for backlighting a liquid crystal display. The assembly includes a first light source configured to emit ultraviolet wavelength light and a second light source configured to emit blue wavelength light. A quantum-dot layer is optically coupled with the first and second light sources so that the ultraviolet wavelength light and the blue wavelength light pass through the quantum-dot layer and are converted into output light comprising the ultraviolet wavelength, the blue wavelength, and at least one wavelength longer than the ultraviolet wavelength and the blue wavelength. A selectively-reflective layer is optically coupled with the quantum-dot layer such that a first portion of the output light having the ultraviolet wavelength is reflected toward the quantum-dot layer, and a second portion of the output light having the blue wavelength and the at least one wavelength longer than the blue wavelength is transmitted through the selectively-reflective layer. A liquid crystal display is optically coupled with the light-emitting assembly such that the second portion of the output light is directed through the liquid crystal display.

In yet further aspect, the inventive concepts disclosed herein are directed to a method for generating tunable white light. The method may include optically coupling one or more UV emitting LEDs and one or more blue emitting LEDs to a layer of quantum dots. The method may also include driving the one or more UV emitting LEDs and the one or more blue emitting LEDs to cause them to emit light in the direction of the layer of quantum dots. The method may further include optically coupling a wavelength selective reflecting surface such that the quantum dot layer is interposed between the LEDs and the wavelength selective reflecting surface to reflect unabsorbed UV light passing through the layer of quantum dots back toward the layer of quantum dots.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings.

DETAILED DESCRIPTION OF EXEMPLARY EMBODIMENTS

Figure 1:
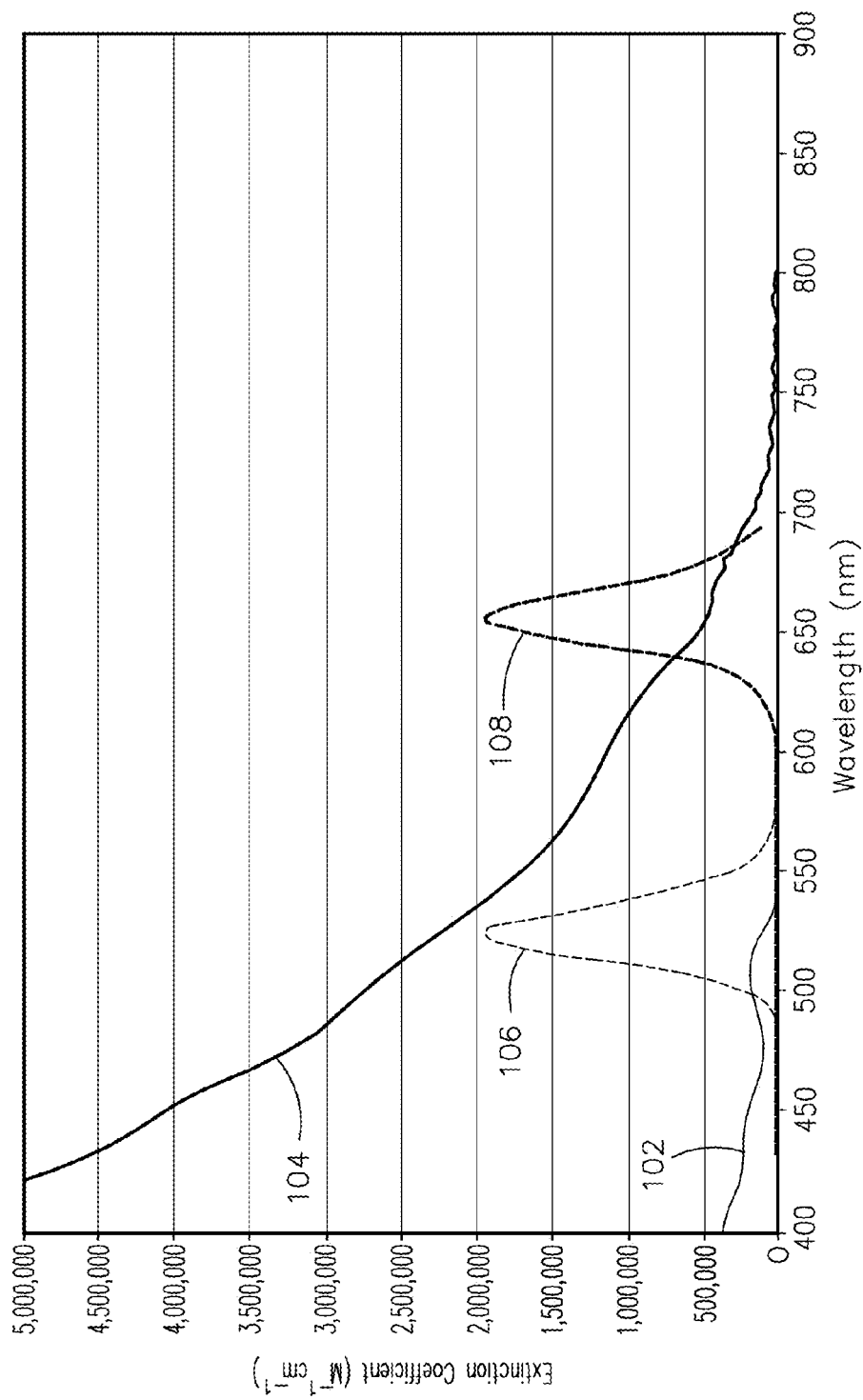
FIG. 1 is a plot of the absorption and emission characteristics of an exemplary set of quantum dot materials.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a' and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Referring now to FIG. 1, a plot of the extinction and emission behaviors of a set of quantum dot materials is shown. Extinction is associated with the light absorption characteristics of a particular type of quantum dot. Emission refers to the light emission of a particular type of quantum dot. Each type of quantum dot has different extinction and emission characteristics represented by the curves in FIG. 1. For example, a first quantum dot material has an extinction curve 102 and an emission curve 106 with peak amplitude at the 525 nanometer wavelength, which is a green light emitter. A second quantum dot material has an extinction curve 104 and an emission curve 108, with peak amplitude at the 655 nanometer wavelength, which is a red emitter.

The shape of the extinction curves 102 and 104 in FIG. 1 indicate the relative amount of light that is absorbed by the quantum dots as a function of the wavelength of the incident pumping light, and therefore, the amount of energy that is available to be converted to the output emission of the quantum dot. In general, the energy of the incident light is a direct function of the wavelength according to the formula: $e=hc/\lambda$, where e=energy h=Planck's constant c=velocity of light
λ=wavelength As the wavelength of the incident light gets shorter, the energy increases. The increased energy associated with shorter wavelengths generally results in more energy being imparted to and absorbed by the quantum dots.

Figure 2:
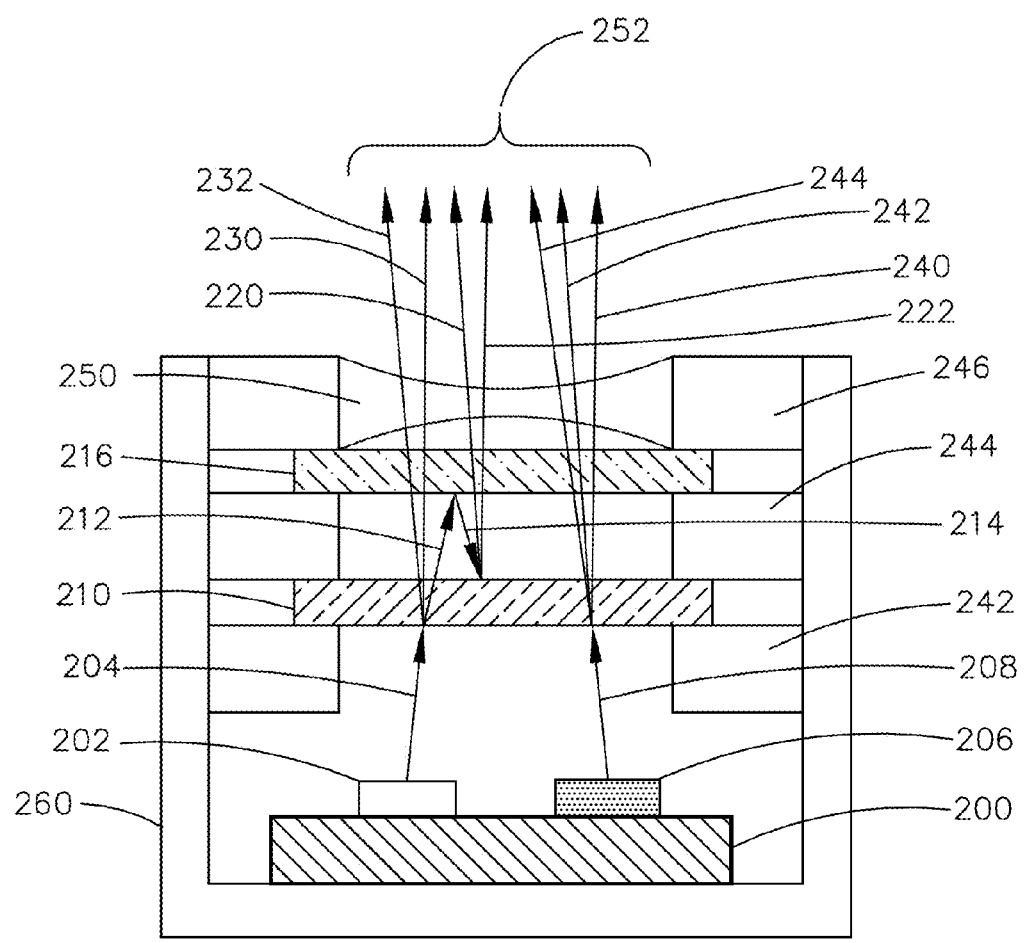
FIG. 2 is a side view of an exemplary embodiment of a white light generating structure according to the inventive concepts disclosed herein.

Referring now to FIG. 2, an exemplary embodiment of a tunable white light generating assembly according to the inventive concepts disclosed herein. A printed wiring board (PWB) 200 or other mounting and electrical connection structure is affixed to a support structure 260. LEDs 202 and 206 are mechanically affixed and electrically connected to PWB 200. The LED 202 may be an ultraviolet light emitting device. The LED 206 may be a blue light emitting device. Ultraviolet light 204 is emitted from the LED 202 toward a quantum dot layer 210 which may contain of a mix of green and red emitting quantum dots, yellow emitting quantum dots, or other color emitting quantum dots. The mixture of quantum dots used may be based on color rendering of the desired illuminant. Blue light 208 is similarly emitted from the LED 206 toward a quantum dot layer 210. The ultraviolet light 204 pumps the green and red quantum dots in the quantum dot layer 210, which causes emission of green light 230 and red light 232. Similarly, the blue light 208 pumps the green and red quantum dots in the quantum dot layer 210, which causes emission of green light 240 and red light 242.

A dielectric mirror substrate or a selectively-reflective layer 216 having a wavelength selective reflectance is placed in a position such that the quantum dot layer 210 is interposed between the LEDs 202 and 206, and the selectively-reflective layer 216. The selectively-reflective layer 216 is configured to pass wavelengths longer than the ultraviolet pumping wavelength, such as blue, green and red, and to reflect wavelengths shorter than blue pumping wavelength. In an exemplary embodiment, the blue LED 206 may have a wavelength in the range of 440-460 nanometers, the ultraviolet LED 202 may have a wavelength in the range of 350-410 nanometers, 350-370 nanometers, 370-390 nanometers, or 390-410 nanometers, and the selectively-reflective layer 216 may have a cutoff wavelength between the wavelengths of the LED 202 and the LED 206 in the range of about 420-430 nanometers, whereby wavelengths longer than the cutoff wavelength of selectively-reflective layer 216 pass through the selectively-reflective layer 216, and wavelengths shorter than the cutoff wavelength of selectively-reflective layer 216 are reflected back.

A portion of the ultraviolet light 204 emitted by the LED 202 will be absorbed by the green and red quantum dots in the quantum dot layer 210, which will cause emission of green light 230 and red light 232 that will pass through the selectively-reflective layer 216. The portion of the ultraviolet light 204 that is not absorbed by the green and red quantum dots in the quantum dot layer 210 is potentially wasted ultraviolet pumping light 212. The ultraviolet light 212 continues toward the selectively-reflective layer 216, where it is reflected rather than transmitted due to the wavelength selective reflectance characteristic of the selectively-reflective layer 216. The reflected ultraviolet light 214 is directed back toward the quantum dot layer 210, where it has another chance to be absorbed by the green and red quantum dots causing emission of green light 222 and red light 220, thereby increasing the overall green and red light conversion efficiency of the ultraviolet light 204 from the LED 202.

The LED 206 emits blue light 208 toward the quantum dot layer 210. A portion of the blue light 208 emitted by the LED 206 will be absorbed by the green and red quantum dots in the quantum dot layer 210, which will cause emission of green light 240 and red light 242 that will pass through the selectively-reflective layer 216. The remaining portion of the blue light 204 that is not absorbed by the green and red quantum dots in the quantum dot layer 210 also passes through the selectively-reflective layer 216 and is a blue component 244 that is mixed with green and red light emitted by the quantum dots to appear to the human eye as white light.

The increased energy associated with the shorter ultraviolet wavelength light 204 emitted by the LED 202 results in more energy being imparted to and absorbed by the quantum dots than the longer blue wavelength light 208 emitted by the LED 206. This increased absorbed energy in the quantum dots may cause increased green and red light emission from the quantum dots. The result may be an increased amount of the green and red components of the light generated from the LED 202 as compared to the green and red components of the light generated from the LED 206 for an equivalent amount of power.

The ultraviolet LED 202 and the blue LED 206 may be driven by an electronic circuit that varies the relative amount of power applied to each LED. In the configuration of FIG. 2, if the power applied to the LED 202 is greater than the power applied to the LED 206, a greater amount of green and red light will be produced relative to the amount of blue light, resulting in a white light spectrum that has a more yellow appearance. If the power applied to the LED 206 is greater than the power applied to the LED 202, a smaller amount of green and red light will be produced relative to the amount of blue light, resulting in a white light spectrum that has a more blue appearance. The color of the white light may be tuned by varying the relative power applied to the LEDs 202 and 206 in this manner.

The light generating components of FIG. 2, including the printed wiring board 200, the LEDs 202 and 206, the quantum dot layer 210, and the dielectric mirror substrate 216 may be disposed within the support structure 260. The support structure 260 may provide mechanical support for mounting structures 242, 244 and 246 to hold the quantum dot layer 210 and the dielectric mirror substrate 216 in place. A refracting element 250 may be placed above the white light generating elements to affect the radiation pattern of the white light 252 produced by the device.

Figure 3:
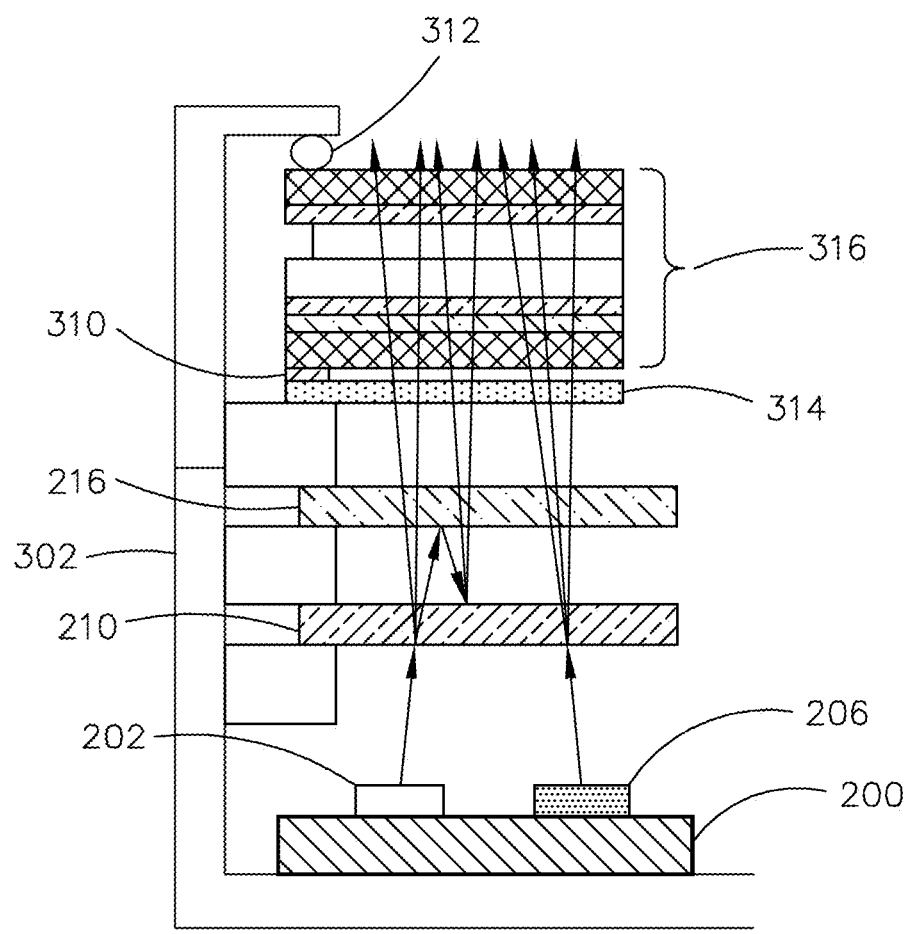
FIG. 3 is a side view diagram of a liquid crystal display assembly using the light generating structure of FIG. 2.

Referring now to FIG. 3, an exemplary embodiment of a tunable white light generating assembly for providing backlight for a liquid crystal display according to the inventive concepts disclosed herein is shown. The light generating components of FIG. 2 may be disposed within a support 302. The support 302 provides mechanical support for the printed wiring board 200, the LEDs 202 and 206, and mounting structures 304, 306 and 308 to hold the quantum dot layer 210 and the selectively-reflective layer 216 in place. An optical diffuser 314, a supporting spacer pad 310, and a liquid crystal display (LCD) stack 316 may be placed above the light generating components, and may be supported by the mounting structure 310. A gasket 312 may be placed between the liquid crystal display stack and a flange portion of the support 302 to hold the display stack firmly in place. The optical diffuser 314 or other optical light spreading element spreads the light to reduce the appearance of bright or dark areas to cause relatively uniform brightness across the area of the LCD.

Figure 4:
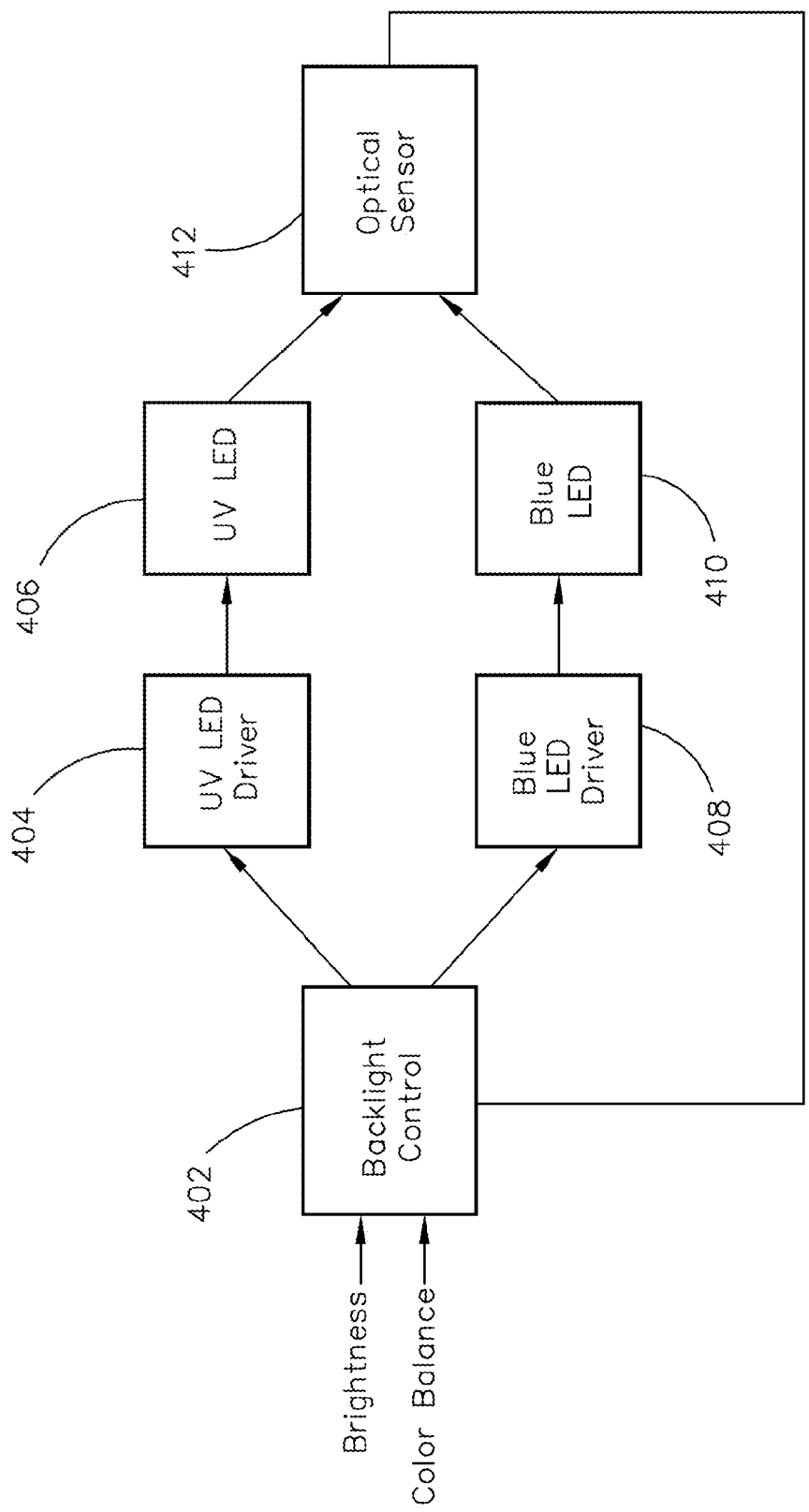
FIG. 4 is a diagram of an exemplary embodiment for controlling the brightness and color balance of a light generating structure for a display according to the inventive concepts disclosed herein.

Referring now to FIG. 4, a block diagram of an exemplary embodiment of an LED drive system is shown. Backlight control block 402 receives inputs that select the brightness and color balance of the tunable white light generating assembly for providing backlight for a liquid crystal display. The backlight control block 402 may receive and process the inputs to provide output controls to drive the UV and Blue LEDs in accordance with the desired backlight brightness and color. This process may use one or more of several LED drive approaches, including varying the pulse width of a relatively fixed current drive circuit to the LED, varying the level of a continuous current drive circuit, or some combination thereof. The backlight control block 402 controls brightness by varying the drive to the UV and Blue LEDs in generally similar manner, where both may be increased or decreased together. The backlight control block 402 controls color balance by varying the drive to the UV and blue LEDs with respect to each other, whereby color shift toward yellow is achieved by increasing the UV LED drive with respect to the blue LED drive; and color shift toward blue is achieved by increasing the blue LED drive with respect to the UV LED drive. Increasing the UV LED drive with respect to the blue LED may be accomplished by any of the following: increasing the UV LED drive while maintaining the blue LED drive at a constant value; by maintaining the UV LED drive at a constant value and reducing the blue LED drive; or by increasing the UV LED drive and decreasing the blue LED drive. Increasing the blue LED drive with respect to the UV LED drive may be accomplished in the same manner. The UV LED driver 404 and blue LED driver 408 may use either a constant current pulsed or variable current continuous drive. UV LED 406 and blue LED 410 may be single LED devices or a plurality of devices connected by one or more electrical conductors to UV LED driver 404 and blue LED driver 408 respectively. An optical sensor block 412 may be provided to sense the brightness and/or color of the generated white light, and may be coupled to the backlight control block 402 to provide feedback to maintain constant brightness and color balanced white light.

Figure 5:
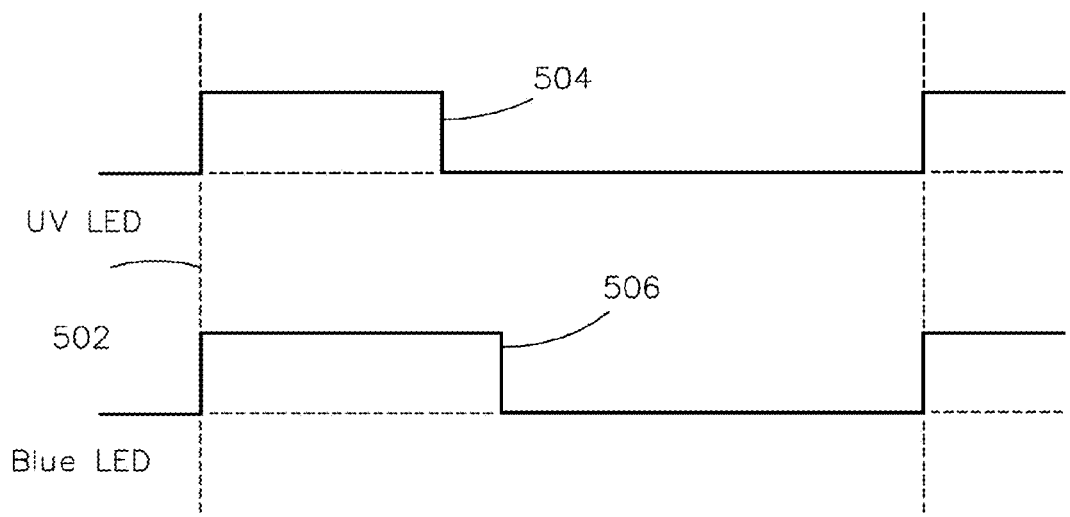
FIG. 5 is a diagram of an exemplary embodiment of the timing relationships for controlling the brightness and color balance of a white light generating source for a display according to the inventive concepts disclosed herein.

Referring now to FIG. 5, an exemplary embodiment of a constant current pulse width modulated UV LED and blue LED drive system such as may be generated by backlight control block 402 of FIG. 4 is shown. In the example, the UV LED and blue LED drive pulses are synchronized at an instant of time 502. The pulse width for the UV LED continues until time 504. The pulse width for the blue LED continues until time 506. An increase in the brightness input would cause the pulse width times 504 and 506 to both increase. A change in color balance to yellow would cause the pulse width time 504 to increase with respect to pulse width time 506, which could be accomplished by any of: increasing the pulse width time 504 while keeping the pulse width time 506 constant; decreasing the pulse width time 506 while keeping the pulse width time 504 constant; or by increasing the pulse width time 504 while decreasing the pulse width time 506. A change in color balance to blue would cause the pulse width time 504 to decrease with respect to pulse width time 506, which could be accomplished by any of: decreasing the pulse width time 504 while keeping the pulse width time 506 constant; increasing the pulse width time 506 while keeping the pulse width time 504 constant; or by decreasing the pulse width time 504 while increasing the pulse width time 506.

Figure 6:
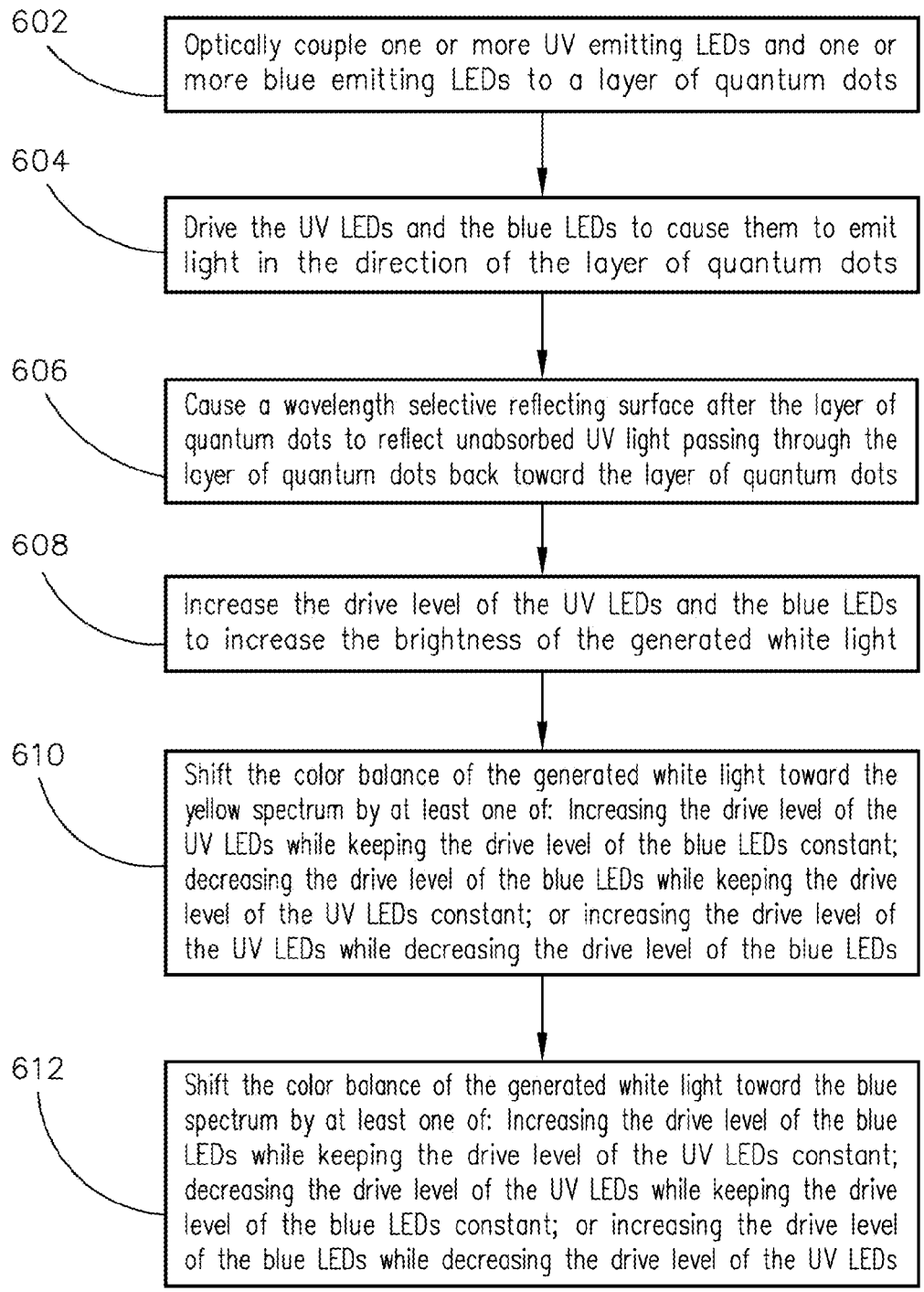
FIG. 6 is a diagram of an exemplary embodiment of a method for generating tunable light according to the inventive concepts disclosed herein.

Referring now to FIG. 6, an exemplary embodiment of a method according to the inventive concepts disclosed herein may include one or more of the following steps.

A step 602 may include physically positioning one or more UV emitting LEDs and one or more blue emitting LEDs in optical proximity of a layer of quantum dots.

A step 604 may include driving the one or more UV emitting LEDs and the one or more blue emitting LEDs to cause them to emit light in the direction of the layer of quantum dots.

A step 606 may include physically positioning a wavelength selective reflecting surface after the layer of quantum dots to reflect unabsorbed UV light passing through the layer of quantum dots back toward the layer of quantum dots.

A step 608 may include increasing the drive level of both of the one or more UV emitting LEDs and the one or more blue emitting LEDs to increase the brightness of the generated white light.

A step 610 may include increasing the drive level of the one or more UV emitting LEDs and decreasing the drive level of the one or more blue emitting LEDs to shift the color balance of the generated white light toward the yellow spectrum.

A step 612 may include decreasing the drive level of the one or more UV emitting LEDs and increasing the drive level of the one or more blue emitting LEDs to shift the color balance of the generated white light toward the blue spectrum.

As will be appreciated from the above, quantum dot tunable assemblies and methods according to embodiments of the inventive concepts disclosed herein may have improved electrical to light conversion efficiency, and may enable tuning of the color balance of the generated white light.

It is to be understood that embodiments of the methods according to the inventive concepts disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

From the above description, it is clear that the inventive concepts disclosed herein are well adapted to carry out the objects and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

What is claimed is:

1. A light-emitting assembly, comprising:
    a first light source configured to emit ultraviolet wavelength light;
    a second light source configured to emit blue wavelength light;
    a quantum-dot layer optically coupled with the first and second light sources so that the ultraviolet wavelength light and the blue wavelength light pass through the quantum-dot layer and are converted into output light comprising the ultraviolet wavelength, the blue wavelength, and at least one wavelength longer than the ultraviolet wavelength and the blue wavelength; and
    a selectively-reflective layer optically coupled with the quantum-dot layer such that a first portion of the output light having the ultraviolet wavelength is reflected toward the quantum-dot layer, and a second portion of the output light having the blue wavelength and the at least one wavelength longer than the blue wavelength is transmitted through the selectively-reflective layer.

2. The assembly of claim 1, wherein the first light source comprises at least one ultraviolet LED, and the second light source comprises at least one blue LED.

3. The assembly of claim 2, wherein the first at least one ultraviolet LED is driven by a first LED driver, and the at least one blue LED is driven by a second LED driver.

4. The assembly of claim 3 further comprising a controller coupled with a first LED driver and a second LED driver, wherein the first LED driver and the second LED driver are driven with a first pulse width and a second pulse width that are controlled to be increased for greater brightness.

5. The assembly of claim 3 further comprising a controller coupled with a first LED driver and a second LED driver, wherein the first LED driver and the second LED driver are driven with a first pulse width and a second pulse width that are controlled to tune the color spectrum of the generated light.

6. The assembly of claim 5, wherein the first pulse width and the second pulse width are controlled to tune the color spectrum of the generated light toward a blue color by at least one of:
    decreasing the pulse width of the drive to the first LED driver and keeping the pulse width of the drive to the second LED driver the same;
    keeping the pulse width of the drive to the first LED driver the same and increasing the pulse width of the drive to the second LED driver; and decreasing the pulse width of the drive to the first LED driver and increasing the pulse width of the drive to the second LED driver.

7. A light-emitting assembly for backlighting a liquid crystal display, comprising:
    a first light source configured to emit ultraviolet wavelength light;
    a second light source configured to emit blue wavelength light;
    a quantum-dot layer optically coupled with the first and second light sources so that the ultraviolet wavelength light and the blue wavelength light pass through the quantum-dot layer and are converted into output light comprising the ultraviolet wavelength, the blue wavelength, and at least one wavelength longer than the ultraviolet wavelength and the blue wavelength;
    a selectively-reflective layer optically coupled with the quantum-dot layer such that a first portion of the output light having the ultraviolet wavelength is reflected toward the quantum-dot layer, and a second portion of the output light having the blue wavelength and the at least one wavelength longer than the blue wavelength is transmitted through the selectively-reflective layer; and
    a liquid crystal display optically coupled with the light-emitting assembly such that the second portion of the output light is directed through the liquid crystal display.

8. The assembly of claim 7, wherein the first light source comprises at least one ultraviolet LED, and the second light source comprises at least one blue LED.

9. The assembly of claim 8, wherein the first at least one ultraviolet LED is driven by a first LED driver, and the at least one blue LED is driven by a second LED driver.

10. The assembly of claim 9 further comprising a controller coupled with a first LED driver and a second LED driver, wherein the first LED driver and the second LED driver are driven with a first pulse width and a second pulse width that are controlled to be increased for greater brightness.

11. The assembly of claim 9 further comprising a controller coupled with a first LED driver and a second LED driver, wherein the first LED driver and the second LED driver are driven with a first pulse width and a second pulse width that are controlled to tune the color spectrum of the generated light.

12. The assembly of claim 11, wherein the first pulse width and the second pulse width are controlled to tune the color spectrum of the generated light toward a blue color by at least one of:
    decreasing the pulse width of the drive to the first LED driver and keeping the pulse width of the drive to the second LED driver the same;
    keeping the pulse width of the drive to the first LED driver the same and increasing the pulse width of the drive to the second LED driver; and
    decreasing the pulse width of the drive to the first LED driver and increasing the pulse width of the drive to the second LED driver.

13. A method for generating tunable white light, comprising:
    optically coupling one or more UV emitting LEDs and one or more blue emitting LEDs to a layer of quantum dots;
    driving the one or more UV emitting LEDs and the one or more blue emitting LEDs to cause them to emit light in the direction of the layer of quantum dots; and
    optically coupling a wavelength selective reflecting surface such that the quantum dot layer is interposed between the LEDs and the wavelength selective reflecting surface to reflect unabsorbed UV light passing through the layer of quantum dots back toward the layer of quantum dots.

14. The method of claim 13, wherein the brightness of the white light is increased by increasing the drive level of both of the one or more UV emitting LEDs and the one or more blue emitting LEDs.

15. The method of claim 14, wherein the brightness and color balance of the white light is controlled by a feedback circuit.

16. The method of claim 15, wherein the color balance of the white light is shifted toward the yellow spectrum by at least one of: increasing the drive level of the UV LEDs while keeping the drive level of the blue LEDs constant; decreasing the drive level of the blue LEDs while keeping the drive level of the UV LEDs constant; or increasing the drive level of the UV LEDs while decreasing the drive level of the blue LEDs.

17. The method of claim 15, wherein the color balance of the white light is shifted toward the blue spectrum by at least one of: Increasing the drive level of the blue LEDs while keeping the drive level of the UV LEDs constant; decreasing the drive level of the UV LEDs while keeping the drive level of the blue LEDs constant; or increasing the drive level of the blue LEDs while decreasing the drive level of the UV LEDs.

18. The method of claim 15, wherein the white light provides illumination for a liquid crystal display.

19. The method of claim 15, wherein the brightness of the white light illumination controls the brightness of a liquid crystal display.

20. The method of claim 15, wherein the color balance of the white light is tuned to compensate for the color balance of a liquid crystal display.

* * * * *